(12) United States Patent
He

(10) Patent No.: US 7,417,323 B2
(45) Date of Patent: Aug. 26, 2008

(54) NEO-WAFER DEVICE AND METHOD

(75) Inventor: Sambo S. He, Long Beach, CA (US)

(73) Assignee: Irvine Sensors Corp., Costa Mesa, CA (US)

( * ) Notice: Subject to any disclaimer, the term of this patent is extended or adjusted under 35 U.S.C. 154(b) by 0 days.

(21) Appl. No.: 10/703,177

(22) Filed: Nov. 6, 2003

(65) Prior Publication Data

US 2004/0147064 A1 Jul. 29, 2004

Related U.S. Application Data

(60) Provisional application No. 60/424,022, filed on Nov. 6, 2002.

(51) Int. Cl.
*H01L 23/48* (2006.01)
(52) U.S. Cl. ............................. 257/778; 257/782
(58) Field of Classification Search ............... 257/678, 257/774, 777, 778, 782, 783, 795; 438/118
See application file for complete search history.

(56) References Cited

U.S. PATENT DOCUMENTS

| 6,365,441 | B1 * | 4/2002 | Raiser et al. | 438/127 |
| 6,660,565 | B1 * | 12/2003 | Briar | 438/122 |
| 6,670,223 | B2 * | 12/2003 | Gaynes et al. | 438/118 |
| 6,673,653 | B2 * | 1/2004 | Pierce | 257/774 |
| 6,919,224 | B2 * | 7/2005 | Sane et al. | 438/106 |

* cited by examiner

*Primary Examiner*—Kevin M Picardat
(74) *Attorney, Agent, or Firm*—W. Eric Boyd, Esq.

(57) ABSTRACT

A neo-wafer made from integrated circuit die and methods for making a neo-wafer are disclosed. A substrate is provided and includes a dielectric layer with conductive pads for the receiving of one or more integrated circuit die. Die are flip-chip bonded to the conductive pads and all voids under-filled. The neo-wafer is thinned to expose the conductive pads, creating a neo-wafer from which stackable neo-layers with known good die can be singulated.

5 Claims, 2 Drawing Sheets

NEO-WAFER DEVICE AND METHOD

CROSS REFERENCE TO RELATED APPLICATIONS

This application is related to U.S. Provisional patent application Ser. No. 60/424,022, filed on Nov. 6, 2002, which is incorporated herein by reference and to which priority is claimed pursuant to 35 USC 119.

STATEMENT REGARDING FEDERALLY SPONSORED RESEARCH AND DEVELOPMENT

N/A

BACKGROUND OF THE INVENTION

1. Field of the Invention

A device and methods are disclosed that provide ultra-thin, stackable wafers and layers incorporating fully tested and functional singulated integrated circuit die or modified integrated circuit packages. This disclosed invention takes advantage of, and advances related approaches to making and assembling ultra-thin, stackable layers such as those disclosed in U.S. Pat. Nos. 5,953,588, 6,072,234, 6,117,704, and 6,195,268, all of which are incorporated herein by reference.

Specifically, the invention relates to methods for creating a "neo-wafer" from previously singulated integrated circuit die or thinned commercial of the shelf (COTS) integrated circuit packages and also relates to a neo-wafer created according to the methods. The invention is suitable for creating neo-wafers for use in wafer-scale integration, manufacturing of multi-chip modules, wafer-scale, three-dimensional packaging, and in processes requiring build up of non-silicon based circuitry on the surface of a previously tested wafer.

2. Description of the Prior Art

Microelectronic packages typically include an integrated circuit die formed on a semiconductor material, which as been bonded to a lead frame and encapsulated in a plastic material. The integrated circuit die themselves are manufactured by creating multiple, individual die on a single, standard geometry semiconductor wafer using well known industry techniques. After manufacturing and testing of the die at the wafer level, the individual die are diced, or singulated, for use in a variety of microelectronic package formats.

There is a need in the industry to recreate "neo-wafers" from die that have previously been singulated from the original semiconductor wafer or from modified COTS microelectronic packages. Applications for neo-wafers include uses in wafer-scale integration, manufacturing of multi-chip modules, wafer-scale, three-dimensional packaging, and in processes requiring build up of non-silicon based circuitry on the surface of a previously tested wafer.

In the case of wafer-scale integration, there is a requirement that the wafer contain only tested and fully functional die and that no failed die exist on the wafer. Present wafer manufacturing techniques make 100% die yield on a single wafer generally unattainable.

In the field of multi-chip module manufacturing, the object of the invention is to provide a neo-wafer with a heterogeneous mix of die, potentially manufactured using different processes and foundries.

Neo-wafers incorporating heterogeneous or homogeneous die are also beneficially used in wafer-scale, three-dimensional packaging where wafers containing integrated circuit die are stacked, diced and the individual layers interconnected to form high-density electronic modules. In such applications, 100% die yields are desirable on each wafer in the stack to ensure a failed individual die does not result in making the entire stacked module in which it is incorporated useless.

Finally, the process of non-silicon circuit build up necessitates the reassembly of fully functional individual die into a wafer so that wafer level processes, such as deposition, lithography, and doping, can be performed on the surface of the rewafered die.

Unfortunately, it is presently difficult to create neo-wafers, particularly because of the problem of integrated circuit die alignment on the neo-wafer. It is desirable that the die incorporated into the neo-wafer be aligned and oriented with the same degree of accuracy as found in conventional wafers before die singulation.

It is therefore an object of the disclosed invention to address the die alignment problem while creating a neo-wafer that is compatible with industry standard wafer level processes that can be handled and processed in the same manner as a standard, non-singulated, semiconductor wafer.

BRIEF SUMMARY OF THE INVENTION

The present invention includes an embodiment for making the placement of die in the neo-wafer highly accurate while making it relatively simple to include multiple die in a neo-wafer. The neo-wafer is structured so that each die contained therein is precisely located by use of simple process steps. Integrated circuit (IC) chips in the form of singulated die or thinned microelectronic packages are flip-chip bonded to a sacrificial substrate in the neo-wafer and encapsulated in a dielectric potting material. The IC chips within the neo-wafer are simultaneously processed for stacking. In this manner, individual, stackable layers containing known good die (KGD) may be diced from the neo-wafer and stacked and interconnected to form high density, multi-layer modules.

Because the present invention locates and aligns the IC chips in the neo-wafer using photo-patterning (photo-lithography), the relative locations of the die are determined with the very high precision inherent in such techniques.

An illustrated embodiment of the invention comprises an isolation layer formed on a sacrificial wafer-shaped substrate. Conductive pads are created thereon for the receiving and electrical interconnection of one or more IC chips. IC chips including known good die are flip-chip bonded to the conductive pads and all voids between the substrate and IC chips are under-filled. The entire wafer is encapsulated in a dielectric layer. The dielectric layer is planarized to the inactive surface of the encapsulated IC chips. The sacrificial substrate is removed to expose the isolation layer. A predetermined portion of the isolation layer is removed so as to expose the conductive pads, forming a neo-wafer containing all known good die.

An alternative embodiment includes etching patterns directly into the isolation layer for the receiving of ball bonded die or modified prepackaged integrated circuit chip. Yet another alternative embodiment includes the incorporation of a stiffening member into the neo-wafer to enhance the mechanical stability of the neo-wafer.

While the claimed apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112.

The invention can be better visualized by turning now to the following drawings wherein like elements are referenced by like numerals among the several views.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

Figure 1:
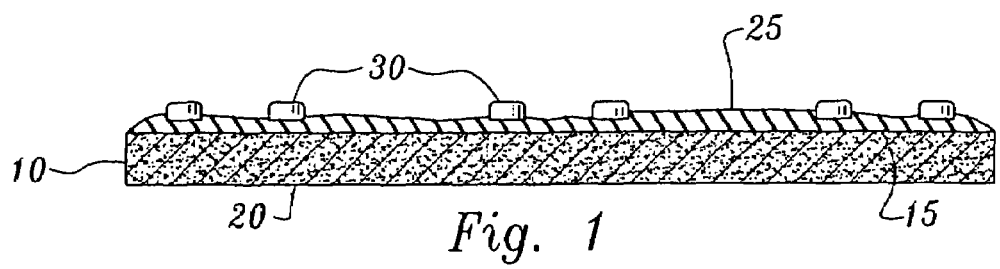
FIG. 1 is a cross-section of the present invention showing the substrate, isolation layer and pads.

FIG. 1 shows a planar substrate 10 with a first surface 15 and a second surface 20. Substrate 10 is preferably an aluminum or silicon material of the desired end wafer diameter.

A dielectric isolation layer 25 is applied to first surface 15. Isolation layer 25 is preferably formed of a polyimide material such as PI-2611 or PI-2555 available from DuPont.

Conductive pads 30 are deposited in the desired pattern on isolation layer 25 using standard photo-imaging and material deposition techniques as are well-known in the industry. Pads 30 are formed for the receiving and electrical interconnection of ball bonded IC chips which will subsequently be incorporated into the neo-wafer.

The photo-imaging and pad deposition steps create a pad pattern that allows the alignment and electrical interconnection of an integrated circuit die's ball bonded I/O pads with pads 30. Pads 30 are preferably formed of a titanium/tungsten alloy with a gold layer incorporating an appropriate under-bump metallurgy layer and include a solder layer for later flip chip bonding and solder reflow.

Figure 2:
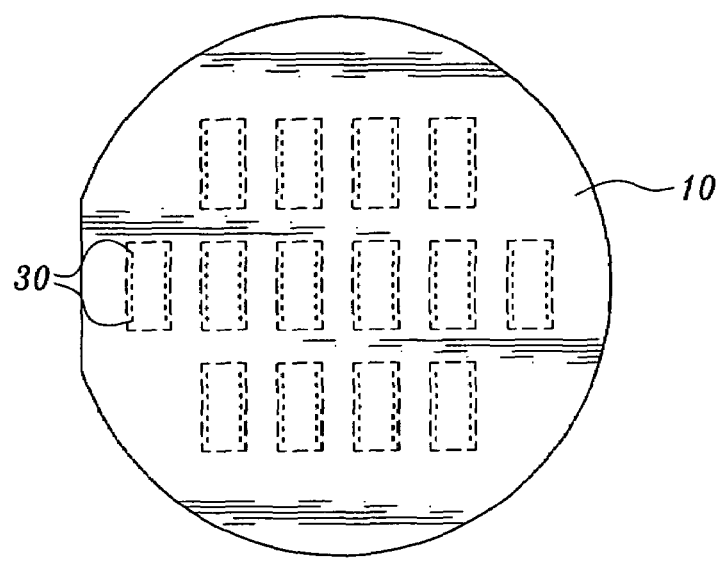
FIG. 2 is a plan view of the present invention showing multiple pad patterns on the substrate.

Multiple sets of pads 30 may be conveniently formed upon substrate 10 to reduce the cost of production as is illustrated in FIGS. 1 and 2.

Figure 3:
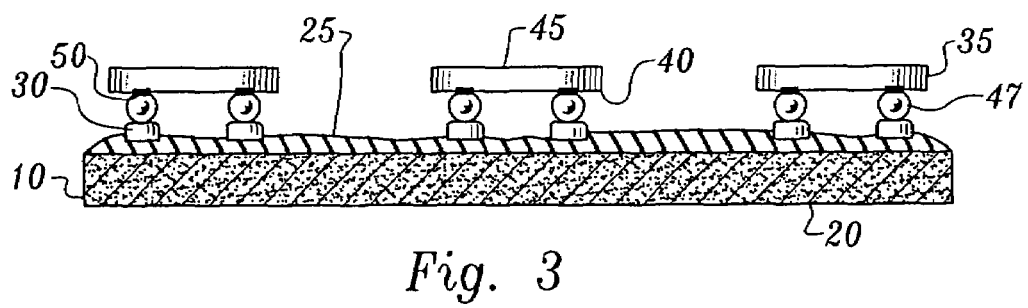
FIG. 3 is a cross-section of the present invention showing IC chips in the form of die connected to pads.

Turning now to FIG. 3, an integrated circuit (IC) chip or die, 35 is flip-chip bonded to pads 30, utilizing well-known integrated circuit assembly techniques, forming a substrate/die assembly so that the active surface 40 of the die is oriented toward substrate 10 and so that inactive surface 45 of the die is oriented away from substrate 10.

Prior to flip chip bonding, conductive balls 47 are preferably applied to die I/O pads 50. Die 35 is preferably a pre-tested, known good die. Conductive balls 47 are preferably gold (Au) but may be any other suitable conductive material and can be applied to I/O pads 50 when the die are at the pre-diced wafer level or on pre-cut, individual die.

Die 35 is then flip chip bonded to pads 30 and solder reflowed to form an electrical interconnect from I/O pad 50 to pad 30 as is known in the art.

Figure 4:
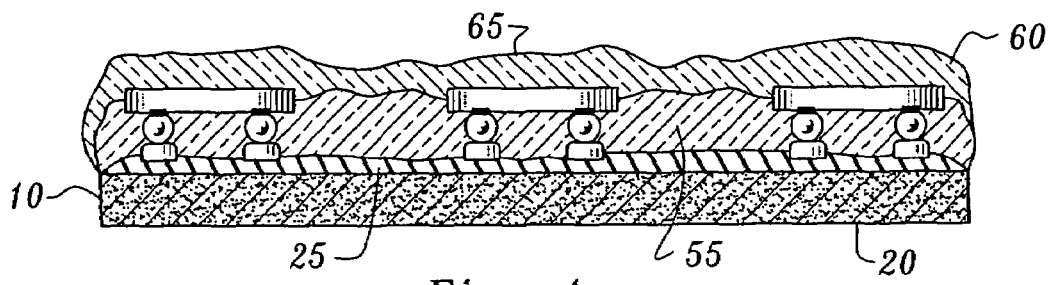
FIG. 4 is a cross-section of the present invention showing the neo-wafer after under-fill and encapsulation.

As seen in FIG. 4, any volume or voids present under and around the flip chip bonded die 35 on the substrate/die assembly are filled, preferably with an under-fill 55 such as EPOXYSET EB-112.

As further seen in FIG. 4, first surface 15 is encapsulated (potted) with a dielectric material 60 such as EPOXYSET M-22 sufficient to encapsulate each of die 35 thereon to form a neo-wafer assembly. The resulting neo-wafer assembly includes a dielectric surface 65.

Figure 5:
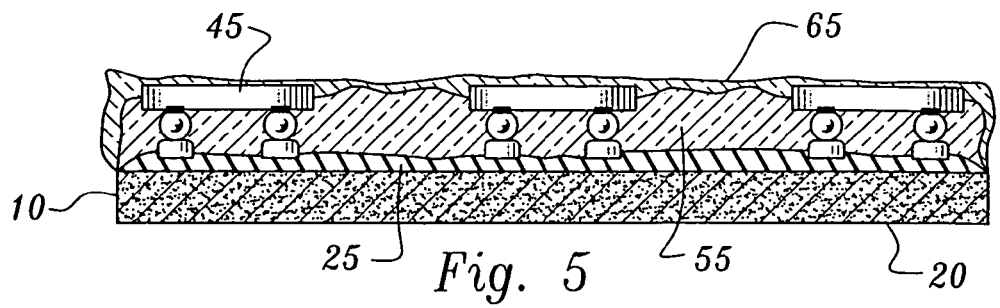
FIG. 5 is a cross-section of the present invention showing the neo-wafer after back-thinning.

The neo-wafer assembly is mechanically stable at this point and capable of withstanding stresses induced by mechanical thinning processes such as grinding or lapping. As illustrated in FIG. 5, in the first phase of the thinning process, dielectric surface 65 is ground, or "back-thinned" a predetermined amount, up to and coplanar with inactive surface 45 of die 35 so as to planarize dielectric surface 65. Second surface 20 of substrate 10 may conveniently be used as a reference plane during this first phase of the thinning process.

Figure 6:
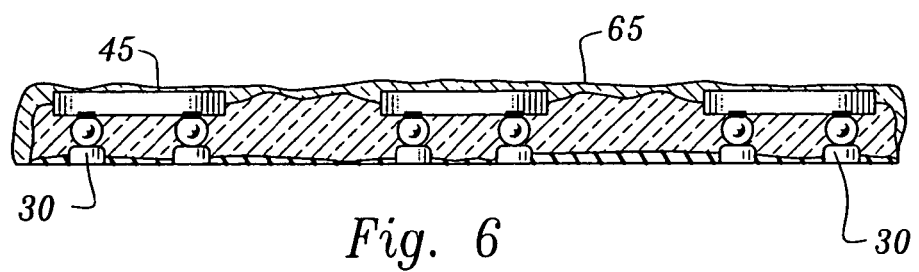
FIG. 6 is a cross-section of the present invention showing the neo-wafer after the substrate has been removed.

As seen in FIG. 6, when the desired amount of material has been removed from dielectric surface 65, substrate 10 is chemically or mechanically removed, preferably using chemical etching techniques so as to expose isolation layer 25.

A predetermined portion of isolation layer 25 is then removed by mechanical or chemical techniques so as to expose pads 30, to allow the electrical interconnection of die 35 through exposed pads 30.

The resulting device is an ultra-thin, highly planar, neo-wafer of one or more encapsulated integrated circuit die. The neo-wafer may then be diced to create ultra-thin, stackable neo-chips with similar coefficients of thermal expansion, each of which may be passivated and provided with conductive traces and assembled in layers to form compact electronic assemblies, such as is disclosed in the U.S. patents referenced above.

In an alternative embodiment (not shown), the die's ball bond pattern or "footprint" may be etched into isolation layer 25 without the creation of pads 30. Conductive balls 47 are inserted into and received by the etched footprint and the substrate/die assembly is under-filled and potted as above. Back-thinning and substrate removal are also accomplished as above. Exposed isolation layer 25 is subjected to a fine mechanical grinding, also referred to as "kiss grinding," so as to expose conductive balls 47.

The result is a neo-wafer with similar properties to the neo-wafer discussed above. Utilizing this method avoids the need to use TiW/Au/solder bond pads on the isolation surface in exchange for the precise die and pad alignment available using the bond pad deposition embodiment.

A further alternative embodiment of the invention includes the use of pre-packaged IC chip (a commercial off the shelf part or "COTS") in lieu of bare die, which packages have been modified or thinned so as to expose the ball bond pattern on the die within the package. Conductive balls 47 can readily be applied to the exposed ball bonds on the modified packages and the modified package flip chip bonded in place of bare die. The pre-packaged devices have the advantage of being pre-tested and being readily available.

Figure 7A:
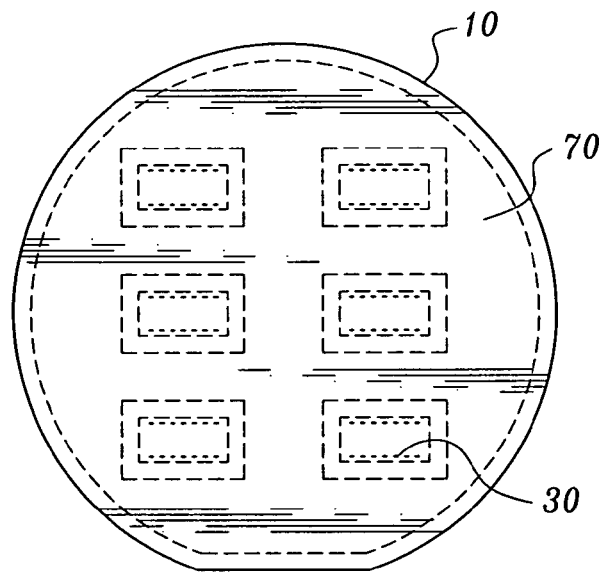
FIGS. 7a and 7b are a plan view and cross section, respectively, of the neo-wafer showing the incorporation of a stiffening member.
Figure 7B:
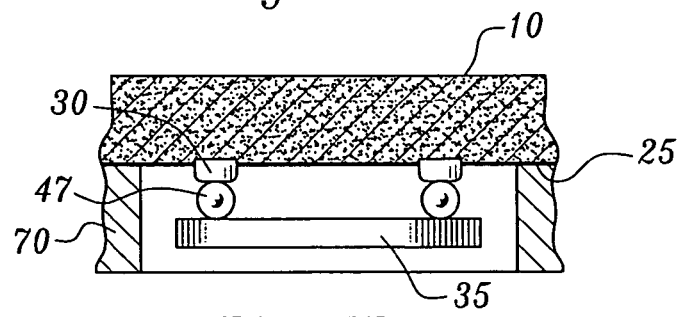

A further alternative embodiment includes the use of a stiffening member or window 70 made of a material such as KAPTON as shown in FIGS. 7a and 7b whereby stiffening member 70 is applied to and is coplanar with isolation layer 25 after flip chip bonding and before under-fill. Stiffening member 70 is applied so as to be integral with and to mechanically stabilize the resulting neo-wafer.

Note the disclosed processes herein may be used for homogeneous or heterogeneous integrated circuit die which have different functions and different surface areas.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

I claim:

1. A neo-wafer comprising:
   at least one IC chip with an active surface and an inactive surface, said active surface having at least one I/O pad,
   an isolation layer, said isolation layer having at least one conductive pad formed thereon,
   said at least one IC chip disposed upon said isolation layer, said active surface oriented toward said isolation layer,
   an electrical interconnection between said conductive pad and said I/O pad, an under-fill material disposed in the volume between said active surface and said isolation layer,
   said at least one IC chip encapsulated in an encapsulant, and,
   said at least one conductive pad exposed upon the surface of and electrically accessible through said isolation layer.

2. The neo-wafer of claim 1 wherein said isolation layer is comprised of a polyimide material.

3. The neo-wafer of claim 1 wherein said at least one conductive pad is exposed by means of a back-thinning process.

4. The neo-wafer of claim 1 wherein said at least one conductive pad is exposed by means of a mechanical grinding process.

5. The neo-wafer of claim 1 wherein said at least one conductive pad is exposed by means of a chemical etching process.

* * * * *